United States Patent [19]
Roethlingshoefer et al.

[11] Patent Number: 5,599,414
[45] Date of Patent: Feb. 4, 1997

[54] METHOD OF MANUFACTURING MULTILAYERED CERAMIC STRUCTURES

[75] Inventors: Walter Roethlingshoefer; Ulrich Goebel, both of Reutlingen, Germany

[73] Assignee: Robert Bosch GmbH, Stuttgart, Germany

[21] Appl. No.: 322,717

[22] Filed: Oct. 13, 1994

[30] Foreign Application Priority Data

Nov. 5, 1993 [DE] Germany .......................... 43 37 749.1

[51] Int. Cl.⁶ ............................. B32B 31/18; B32B 31/26
[52] U.S. Cl. ............................. 156/89; 156/250; 264/61; 264/67; 361/321.2
[58] Field of Search ............................. 361/321.2, 321.3, 361/321.4, 321.5; 264/61; 156/89

[56] References Cited

U.S. PATENT DOCUMENTS

| 3,683,245 | 8/1972 | Bacher et al. | |
|---|---|---|---|
| 4,241,378 | 12/1980 | Dorrian | 264/61 X |
| 5,101,319 | 3/1992 | Diffeyes et al. | 361/321.2 |
| 5,440,794 | 8/1995 | Kaeriyama et al. | 361/321.2 X |

*Primary Examiner*—James Engel
*Assistant Examiner*—M. Curtis Mayes
*Attorney, Agent, or Firm*—Kenyon & Kenyon

[57] ABSTRACT

In a method, which permits the application of porous plates inside of multilayered ceramic structures, dense regions are formed in the edge areas of the porous plates. The dense regions prevent fluids, gases and vapors from penetrating to the inside of the multilayered ceramic structure.

7 Claims, 1 Drawing Sheet

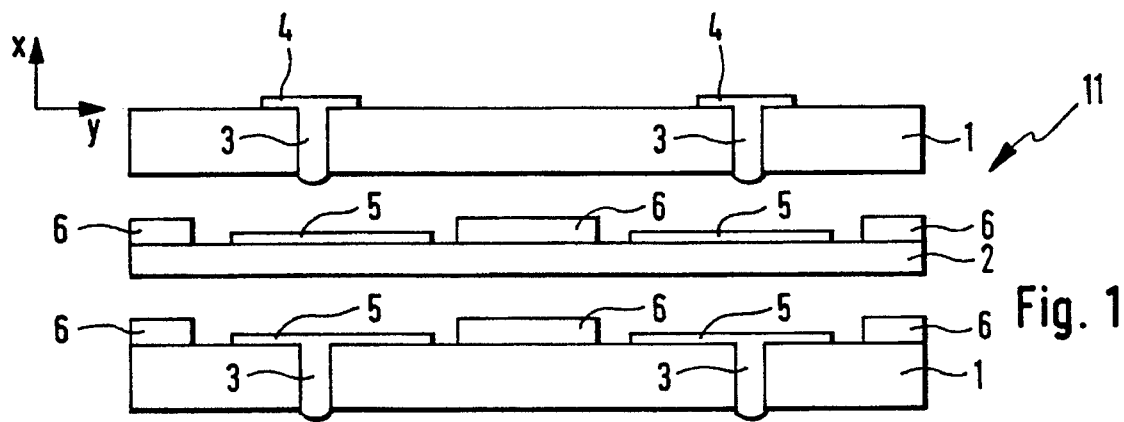
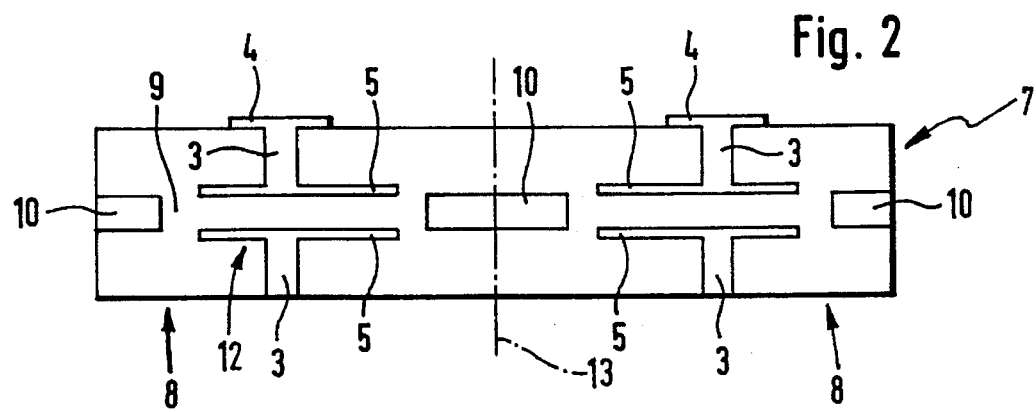

METHOD OF MANUFACTURING MULTILAYERED CERAMIC STRUCTURES

FIELD OF THE INVENTION

The present invention relates to a method of manufacturing multilayered ceramic structures.

BACKGROUND INFORMATION

German Patent Application No. DE 42 33 403 describes a method of making multilayered ceramic structures, in the case of which several green sheets are arranged in a stack and joined to one another by means of firing. An already fired ceramic sheet of a material having a high dielectric constant is arranged in the stack.

SUMMARY OF THE INVENTION

An advantage of the method according to the present invention is that it is suited for developing porous plates in the multilayered ceramic structure. Dense regions can be used to protect sections of the porous plate where the porosity would adversely affect the function of the multilayered ceramic structure. The method according to the present invention, in part, makes use of conventional methods used in the manufacturing of multilayered ceramic structures, so that it can be realized without entailing considerable additional expenditure.

Since, as a rule, ceramic plates having a high dielectric constant are porous, the method according to the present invention makes it possible for porous plates having large dielectric constants to be used. Such plates made of green ceramic sheets can be produced quite simply using particles of a material having a high dielectric constant. These types of plates allow the formation of capacitors having especially large capacitances. It is especially simple to form the dense regions through the application of a dense mass of glass. By configuring the special sheet between two green ceramic sheets and forming the dense regions in the edge area of the multilayered ceramic structure, the porous region can be completely shut off from the outside world, so that no fluids, gases or vapors can penetrate into the multilayered ceramic structure. Furthermore, the method according to the present invention is advantageously suited for forming a plurality of multilayered ceramic structures out of a multilayered ceramic plate.

BRIEF DESCRIPTION OF THE DRAWINGS

FIG. 1 shows a stack of ceramic sheets according to the present invention.

FIG. 2 shows a multilayered ceramic structure, which results from firing the stack of ceramic sheets shown in FIG. 1, according to the present invention.

DETAILED DESCRIPTION

In an exploded view, FIG. 1 shows a stack 11 comprising two green ceramic sheets 1 and a special sheet 2. The dimensions in the x-direction are exaggerated. The green ceramic sheets 1 have holes (referred to as vias) 3 filled with metal, which enable a contacting from the top side to the bottom side of the ceramic sheets 1. In addition, conductors 4 are provided on the ceramic sheets 1. Structures for electrodes 5, which can each be contacted through vias 3, are arranged on the special sheet 2, respectively on the green ceramic sheets 1. A dense mass 6 is arranged so as to directly border the special sheet 2.

The multilayered ceramic plate 7 shown in FIG. 2 is produced by compressing the sheets 1, 2 depicted in FIG. 1 and as the result of a firing operation, i.e., heating to temperatures of over 800° C. The multilayered ceramic plate is divided (diced) into two multilayered ceramic structures 8 along the line of separation 13. In the middle of each multilayered ceramic structure 8, there is a porous plate 9, which is formed by firing the special sheet 2. Situated in each case in the edge areas of the multilayered ceramic structure 8 is a dense region 10, which is formed as the result of a penetration of the dense mass 6 into the special sheet 2 during the firing operation. In contrast to the porous plate 9, these dense regions 10 are hermetically sealed (impervious) and make it more difficult or prevent gases, fluids or vapors from penetrating inside the multilayered ceramic structure 8.

As a result of the electrodes 5 and the porous plate 9 arranged in-between, capacitors 12 are formed. These capacitors 12 are contacted by the vias 3, or rather by the conductors 4. One can conceive of any desired multiple arrangement of green ceramic sheets 1 or special sheets 2, even though the stack 11 is shown herein in a simplified embodiment with only two green ceramic sheets 1 and one special sheet 2. The various layers for conductors 4, vias 3, and dense masses 6 can be applied, for example, using screen printing methods. It is equally possible for individual plates to be provided with such layers from both sides, or not at all.

As a rule, the green ceramic sheets include an organic binding agent, an inorganic binding agent, and a ceramic filler. During the firing process, the organic binding agent is initially converted into a gaseous state and is thus expelled from the sheets. In a further firing phase, the inorganic binding agent, as a rule a glass, is sintered with the filler, as a rule a finely triturated ceramic powder. A sintering process also takes place in this case among the various sheets, so that they are joined together so as to be mechanically fixed.

Normally, fillers having a low dielectric constant are used for green ceramic sheets, so that the capacitances among the different conductors are small. However, by using the special sheet 2, fillers with other properties can also be used, in particular fillers having a very high dielectric constant, which allow the development of capacitors having high capacitance values. Since, as a rule, the substances commonly used for inorganic binding agents have a low dielectric constant, a small portion of inorganic binding agent is added for sheets which have a high dielectric constant after the firing operation. Therefore, such sheets usually exhibit considerable porosity after the firing operation.

When highly porous layers are in contact with the environment surrounding the multilayered ceramic structure, gases, liquids or vapors can penetrate through the fine pores into the multilayered ceramic structure. The capacitance of the capacitors that are formed would thus depend on the prevailing environmental conditions. In addition, substances capable of destroying the multilayered ceramic structure can penetrate from the outside (for instance water, which can freeze inside the multilayered ceramic structure and lead to mechanical breakage).

Therefore, it is problematical to use highly porous materials for multilayered ceramic structures. This problem is solved here by applying a dense mass 6 to the special sheet 2, which then penetrates into the special sheet during the firing process and closes the pores. Especially suited for this is, for example, a glass paste, which is prepared with the proper melting point and viscosity to guarantee a reliable penetration into the porous layer. By appropriately configuring the dense regions 10, a hermetically tight sealing of the porous plate 9 can be achieved inside the multilayered ceramic structure 8.

If plates having high dielectric constants are desired, the method according to the present invention can be applied, of course, to all types of porous plates. By configuring dense regions 10 along the lines of separation 13, the method according to the present invention can also be advantageously applied to the multiple production of multilayered ceramic structures 8 out of a multilayered ceramic plate 7.

In addition, the porous plate 9 is sealed to the top and to the bottom by the dense layer, which is formed as the result of the firing of the green ceramic sheets 1.

What is claimed is:

1. A method of manufacturing a multi-layered ceramic structure, comprising the steps of:

arranging a plurality of ceramic sheets and a special sheet in a stack, the special sheet including at least one section upon which a dense mass is disposed; and joining the ceramic sheets and the special sheet to one another by firing the stack such that, during the firing, the dense mass penetrates into the at least one section of the special sheet and, after the firing, the special sheet forms a porous plate which allows penetration of the porous plate by at least one of fluids, gases, and vapors, except that in the at least one section, the dense mass forms at least one dense region of the porous plate which hinders penetration of the porous plate by at least one of fluids, gases, and vapors.

2. The method according to claim 1, wherein the porous plate has a preselected dielectric constant.

3. The method according to claim 1, wherein a material having a preselected dielectric constant is used as a filler for the special sheet.

4. The method according to claim 1, further comprising the step of:

arranging at least one electrode for a capacitor on each of a top side and a bottom side of the porous plate.

5. The method according to claim 1, further comprising the step of:

arranging the special sheet between two of the plurality of ceramic sheets, the at least one dense region of the porous plate being at an edge area of the structure.

6. The method according to claim 1, further comprising the step of:

dividing the fired stack along a line of separation to form a plurality of multilayered ceramic structures, the line of separation passing through the dense region of the porous plate.

7. A method of manufacturing a multilayered ceramic structure, comprising the steps of:

arranging a plurality of ceramic sheets and a special sheet in a stack, the special sheet including at least one section upon which a dense mass is disposed, the dense mass including a glass; and joining the ceramic sheets and the special sheet to one another by firing the stack such that, during the firing, the dense mass penetrates into the at least one section of the special sheet and, after the firing, the special sheet forms a porous plate which allows penetration of the porous plate by at least one of fluids, gases, and vapors, except that in the at least one section, the dense mass forms at least one dense region of the porous plate which hinders penetration of the porous plate by at least one of fluids, gases, and vapors.

\* \* \* \* \*